United States Patent
Matick et al.

(10) Patent No.: US 7,471,546 B2
(45) Date of Patent: Dec. 30, 2008

(54) HIERARCHICAL SIX-TRANSISTOR SRAM

(75) Inventors: Richard E. Matick, Cortlandt Manor, NY (US); Stanley E. Schuster, Granite Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 11/620,297

(22) Filed: Jan. 5, 2007

(65) Prior Publication Data

US 2008/0165561 A1  Jul. 10, 2008

(51) Int. Cl.
*G11C 11/00* (2006.01)
(52) U.S. Cl. .......................... 365/154; 365/72; 365/156
(58) Field of Classification Search .................. 365/154, 365/156, 72
See application file for complete search history.

(56) References Cited

U.S. PATENT DOCUMENTS

| | | | |
|---|---|---|---|
| 4,633,443 | A | 12/1986 | Childers |
| 5,675,529 | A | 10/1997 | Poole |
| 5,917,744 | A | 6/1999 | Kirihata et al. |
| 5,917,745 | A | 6/1999 | Fujii |
| 5,973,983 | A | 10/1999 | Hidaka |
| 6,130,845 | A | 10/2000 | Ootsuki et al. |
| 6,278,630 | B1 | 8/2001 | Yamada |
| 6,288,969 | B1 | 9/2001 | Gibbins et al. |
| RE37,409 | E | 10/2001 | Barth et al. |
| 6,333,866 | B1 | 12/2001 | Ogata |
| 6,426,905 | B1 | 7/2002 | Dennard et al. |
| 6,442,060 | B1 | 8/2002 | Leung et al. |
| 6,448,818 | B1 | 9/2002 | Fletcher |
| 6,449,201 | B1 | 9/2002 | Kojima |
| 6,456,521 | B1 | 9/2002 | Hsu et al. |
| 6,542,424 | B2 | 4/2003 | Endo et al. |
| 6,650,572 | B2 | 11/2003 | Issa |
| 6,657,886 | B1 | 12/2003 | Adams et al. |
| 6,898,663 | B2 | 5/2005 | Winograd et al. |
| 6,901,017 | B2 | 5/2005 | Shimizu |
| 7,057,230 | B2 | 6/2006 | Tanaka et al. |
| 7,082,076 | B2 | 7/2006 | Terzioglu et al. |
| 7,088,638 | B1 | 8/2006 | Bunce et al. |

(Continued)

FOREIGN PATENT DOCUMENTS

EP  1498903  1/2005

(Continued)

*Primary Examiner*—Anh Phung
*Assistant Examiner*—Hien N Nguyen
(74) *Attorney, Agent, or Firm*—Cantor Colburn LLP; Mark Wardas (57) ABSTRACT

An embodiment of the present invention is an SRAM memory array comprising memory cells with each cell containing six devices, the storage nodes which store the true and complement of the data are constructed from a four device, cross coupled flip-flop cell, wherein one internal storage node of this cell is connected through an access pass gate to one local bit line (LBL), the second internal storage node connected in a like manner to a second LBL, each LBL connected to a limited number, e.g. 8 to 32 of other similar storage cells, the two LBLs each connected to the gate of a separate read head nFET for discharging to ground one of two previously precharged global read lines so as to pass the inverse of the signal on the LBL and thus on the read head gate to a global read/write bit line.

6 Claims, 8 Drawing Sheets

U.S. PATENT DOCUMENTS

| | | |
|---|---|---|
| 7,289,369 B2 * | 10/2007 | Matick et al. .......... 365/185.13 |
| 2005/0018510 A1 | 1/2005 | Terzioglu et al. |
| 2005/0125591 A1 | 6/2005 | Fujimoto |
| 2005/0141258 A1 | 6/2005 | Kang et al. |
| 2006/0023553 A1 | 2/2006 | Takeyama et al. |
| 2006/0067144 A1 | 3/2006 | Liu |

FOREIGN PATENT DOCUMENTS

| | | |
|---|---|---|
| JP | 2004153700 | 5/2004 |

* cited by examiner

PRIOR ART

| Cell Type | Delta Vt for Read Failure | Tacc WL 50% To GBL 50% | # of added devices | # of added BLs and WLs |
|---|---|---|---|---|
| 6T SRAM | 100mV | 624ps | 0 | 0 |
| HB 7T SRAM | 100mV | 168ps | 17 | 1 |
| 8T SRAM | ---- | 444ps | 32 | 1 |
| HB 6T SRAM | 200mV | 167ps | 6 | 0 |
| 6THB_NAND | 250mV | 133ps | 9 | 0 |
| HB 2T DRAM | ---- | 209ps | 6 | 0 |

Assumptions:
- 256 cells per global bit line
- 16 cells per local bit line and 16 local bit lines per global bit line
- HB 2T DRAM ~2X density of 6T SRAMs

Fig. 4

| Cell Type | Delta Vt for Read Failure | Tacc WL 50% to GRBL 50% | # of cells per BL |
|---|---|---|---|
| 6T SRAM | 100mV | 624ps | 256 |
| 6T SRAM | 150mV | 336ps | 128 |
| 6T SRAM | 150mV | 184ps | 64 |
| 6T SRAM | 200mV | 105ps | 32 |

HIERARCHICAL SIX-TRANSISTOR SRAM

CROSS-REFERENCE TO RELATED APPLICATIONS

This application contains subject matter, which is related to the subject matter of the following co-pending applications, each of which is assigned to the same assignee as this application, International Business Machines Corporation of Armonk, N.Y. Each of the below listed applications is hereby incorporated herein by reference in its entirety:

entitled 'Hierarchical 2TDRAM with Self-Timed Sensing', application Ser. No. 11/620,282;

entitled 'Fast, Stable SRAM cell using seven devices and hierarchical bit/sense line', application Ser. No. 11/620,316;

entitled 'eDRAM Hierarchical Differential Sense AMP', application Ser. No. 11/620,328; and entitled 'DRAM Hierarchical Data Path', application Ser. No. 11/620,328. now U.S. Pat. No. 7,289.369.

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to an SRAM memory array comprising memory cells with each cell containing six devices, the basic storage nodes which store the true and complement of the data are constructed from a standard four device, cross coupled flip-flop cell, and in particular to an SRAM memory array wherein one internal storage node of this cell is connected through an access pass gate to one local bit line (LBL), the second internal storage node connected in a like manner to a second LBL, each LBL connected to a limited number, e.g. sixteen to thirty-two of other similar storage cells, the two LBLs each connected to the gate of a separate read head nFET for discharging to ground one of two previously precharged global read lines so as to pass the inverse of the signal on the LBL and thus on the read head gate to a global read/write bit line.

2. Description of Background

Before our invention current six device SRAM cells were encountering significant stability problems as we scale below 0.1 microns. The main reason for this is that the device tolerances, particularly the threshold voltage variations from device to device, do not scale appropriately as the technology scales to smaller dimensions. When an SRAM cell is read, the bit lines are precharged 'HIGH' which places a 'disturb' signal on the '0' node of the cross-coupled flip-flop. For the nominal design case, this 'disturb' signal is quite tolerable; however, if the threshold variations between devices is sufficiently large, this 'disturb' signal can cause some cells to flip state, i.e. a stored '0' becomes a '1' and vice versa. Current SRAM cell designs employ two techniques to circumvent this, 1) reduce threshold variations by making the devices, and hence cell, larger than the smallest size normal scaling rules would allow, and 2), use eight devices per cell, with the extra devices eliminating the 'disturb' signal during reading. Both techniques significantly increase the size of the SRAM cell and hence reduce the density, a very undesirable result.

The design of robust 6T SRAM memory is a key challenge for future microprocessor designs. It is generally agreed that the 6T SRAM design approach is broken due to various technology-scaling issues. These issues make it increasingly difficult to design 6T SRAM memories with acceptable stability, performance, power and yield with the current design approaches. What is needed is an approach that deals with each of these factors over a range of values.

Figure 1A:
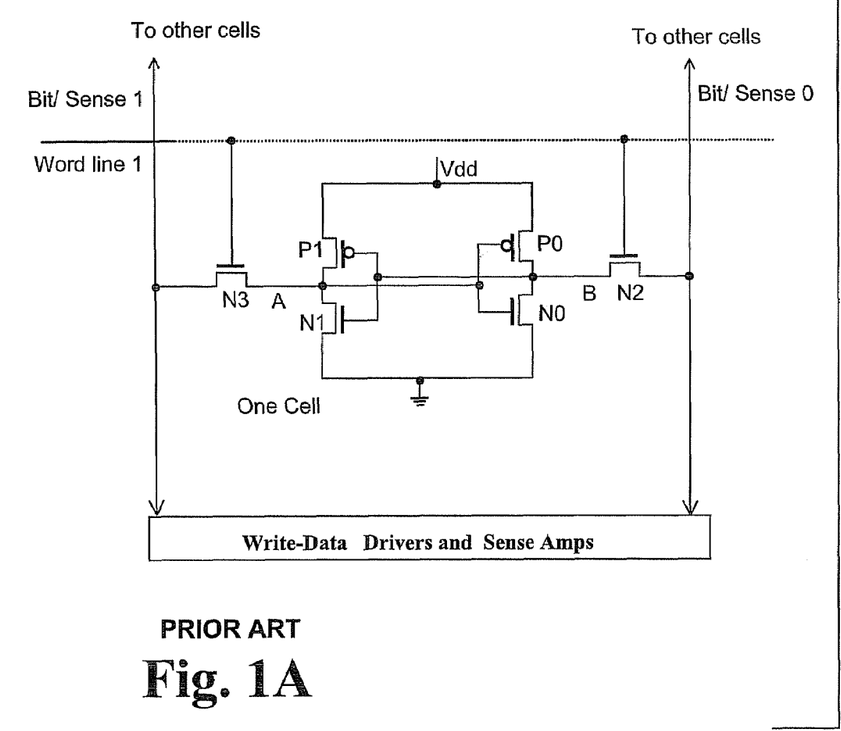
FIG. 1A illustrates one example of a prior art standard 6 device (6T) SRAM cell having 2 internal nodes, 'A' and 'B'.

As technology lithographic dimensions scale below 0.1 microns, FET device tolerances, particularly the threshold voltage variations from device to device, do not scale appropriately as they have in the past—the threshold spread between adjacent or nearby devices is increasing. As a result, SRAM cells are currently, encountering significant stability difficulties. This problem occurs as follows. A typical, standard six device (6T) SRAM cell has two internal nodes, 'A' and 'B' as shown in prior art FIG. 1A which for example store '0'/'1' respectively on the two nodes for a stored '0', and the reverse of '1'/'0' respectively on the nodes for a stored '1'. These two nodes are coupled to a pair of balanced bit/sense lines, which are used for both reading and writing. For reading the state of the cell, both bit lines, which are connected to multiple cells, are precharged high (for example to +Vdd, the power supply voltage) through a separate device (not shown) attached to each bit line. On a 'READ' operation, the desired cell is connected to this precharged bit line pair by activating the word line for this desired cell. This turns 'ON' the two access devices, N2 and N3. As a result, the internal storage node, which happens to currently be latched at '0', will see a large voltage applied to it, which is a 'disturb' signal. If the cross-coupled pair of nFETS N0 and N1 are identical, and likewise if the pFETs P0 and P1 are identical, the cell is stable and the read 'disturb' cannot cause the cell to switch states. However, if the variation in threshold voltages of the cross-coupled nFET and/or pFET devices is sufficiently large, the 'disturb' signal can cause this '0' node to rise sufficiently 'HIGH' such that the cross-coupled arrangement will pull the previously '1' node to '0', thus reversing the stored state, a significant error.

Figure 1B:
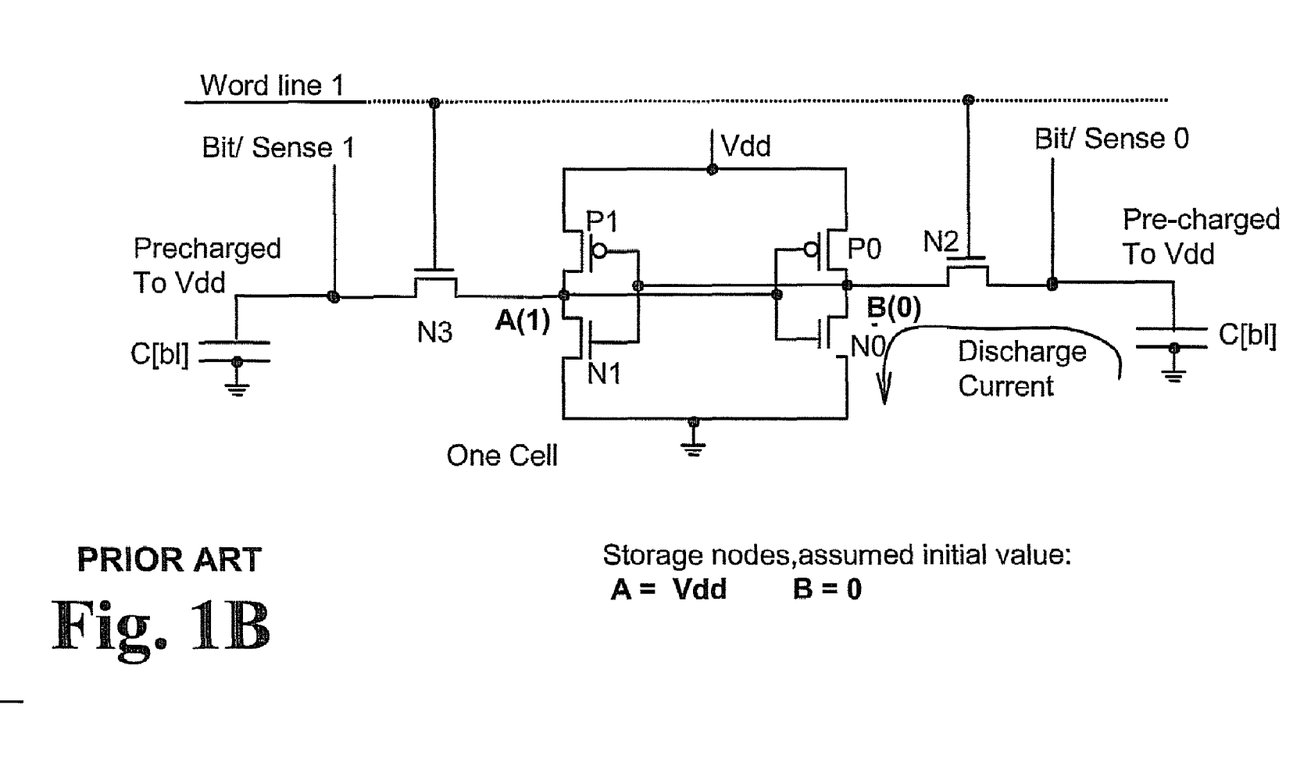
FIG. 1B illustrates one example of a prior art equivalent circuit for the reading of the cross-coupled 6 device SRAM cell.

The fundamental problem, which gives raise to the read 'disturb' can be understood in terms of the capacitance loading, connected to an SRAM cell during reading. An equivalent circuit for the reading of the cross-coupled 6 device SRAM cell, one example of which is illustrated in prior art FIG. 1B, is assumed to have storage node 'B' at '0' volts initially (with node 'A' necessarily at Vdd volts). Currently, in state of the art SRAM design, balanced sensing is used in which a pair of (nearly) identical capacitors, C[bl] (bit line capacitance) are precharged to Vdd and then suddenly connected to nodes 'A' and 'B'. A sense signal is obtained by allowing the cell to develop an offset voltage across this pair, which triggers a differential sense amp. This offset is achieved as follows:

The precharged voltage on its bit line, being already at Vdd, does not affect node 'A'. In fact, a large 'C' on node 'A' will be helpful in holding 'A' at Vdd. However, node 'B', initially at '0', now has a large capacitor, C[bl], the bit line capacitance, at voltage Vdd connected to it. The FET pull-down device, N0, must sink the charge on C[bl] to ground in order to discharge it to some low value, the offset voltage. However, device N0, even in the 'ON' state has a significant resistance, so the voltage from node 'B' to ground will increase above '0'. In the meantime, device N1 has its gate voltage supposedly at '0' (at voltage of node 'B') so it is 'OFF', and P1 is 'ON', which allows node 'A' to remain high. However, if the threshold voltage, Vt, of device N1 just happens to be sufficiently 'LOW', and if node 'B' happens to rise sufficiently 'HIGH', device N1 will start to turn 'ON'. If likewise, the threshold of N0 is higher than that of N1, it is easily turned 'OFF', and the feedback effect of the cross-coupled arrangement will reinforce this supposedly temporary transient swing in voltages and can cause the node voltages at 'A' and 'B' to reverse state, an error.

The culprit in this scenario is the very large bit line capacitance, which makes it difficult to hold node 'B' at '0', plus the large tolerance spread between devices N1 and N0. Note, tolerance spreads between P1 and P0 contribute in a somewhat analogous manner. For instance, with node 'A' at '1' and 'B' at '0' as above, device P1 is 'ON' and holds node 'A' 'HIGH'. If the threshold of P1 is 'HIGH', it will start to turn 'OFF' as node 'B' rises slightly, due to the read 'disturb'. This will start decreasing the original 'HIGH' voltage at node 'A' as node 'B' is raised. If the threshold of P0 is simultaneously 'LOW' compared to P1, then the rising voltage on node 'A' will cause device P0, which was originally 'OFF', to begin to turn 'ON' which reinforces the increasing voltage on node 'B'. This will cause the cell nodes to reverse voltage, and must be avoided.

For a given technology, the threshold variations between adjacent devices become larger as the devices approach minimum dimensions. Thus one method for improving stability is by making the device channel length and width larger, which results in lower density, an undesirable effect. If we wish to increase cell stability without increasing the cell device sizes, the bit line capacitance must be reduced without significantly increasing the effective, average cell size.

SUMMARY OF THE INVENTION

The shortcomings of the prior art are overcome and additional advantages are provided through the provision of an SRAM memory array comprising a plurality of memory cells, each of the plurality of memory cells further comprising a device, each of the plurality of memory cells having six of the device; a first storage node; a second storage node; a first local bit line; a second local bit line; a first global bit line; and a second global bit line; the first storage node and the second storage node store the true and complement of the data and are constructed with four of the devices forming a cross coupled flip-flop cell, the first storage node is connected through a first access pass gate to the first bit line, the second storage node is connected through a second access pass gate to the second local bit line, each of the first bit line and the second bit line are connected to typically sixteen to thirty-two other plurality of memory cells, the first bit line is connected to a first separate read head nFET gate and the second bit line is connected to a second separate read head nFET gate effectuating discharging to ground one of two previously precharged first global bit line or second global bit line so as to pass the inverse of the signal on the first local bit line to the first global bit line and the inverse of the signal on the second local bit line to the second global bit line.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which is an SRAM memory array comprising memory cells with each cell containing six devices organized as a hierarchical approach to 6T SRAM design to improve cell stability, area utilization, and SRAM performance.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 2:
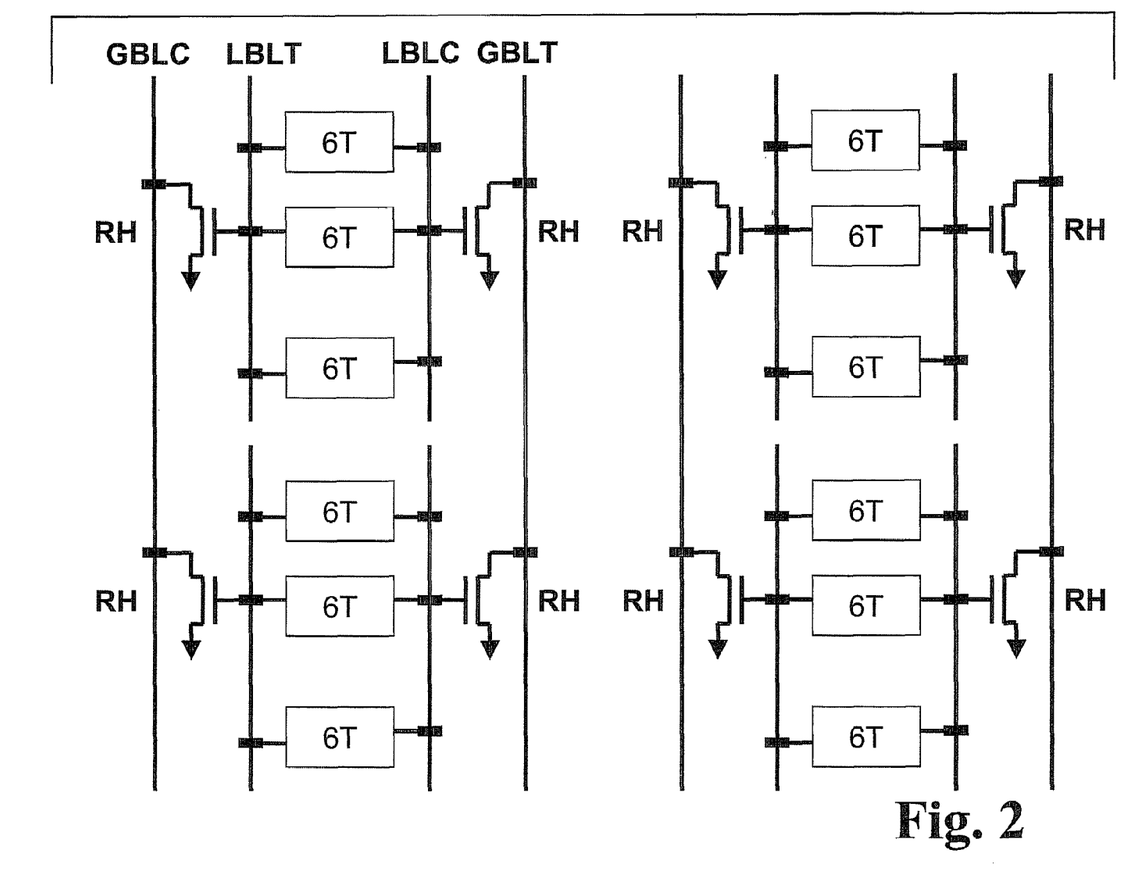
FIG. 2 illustrates one example of a simplified diagram of the hierarchical bit line architecture.
Figure 3:
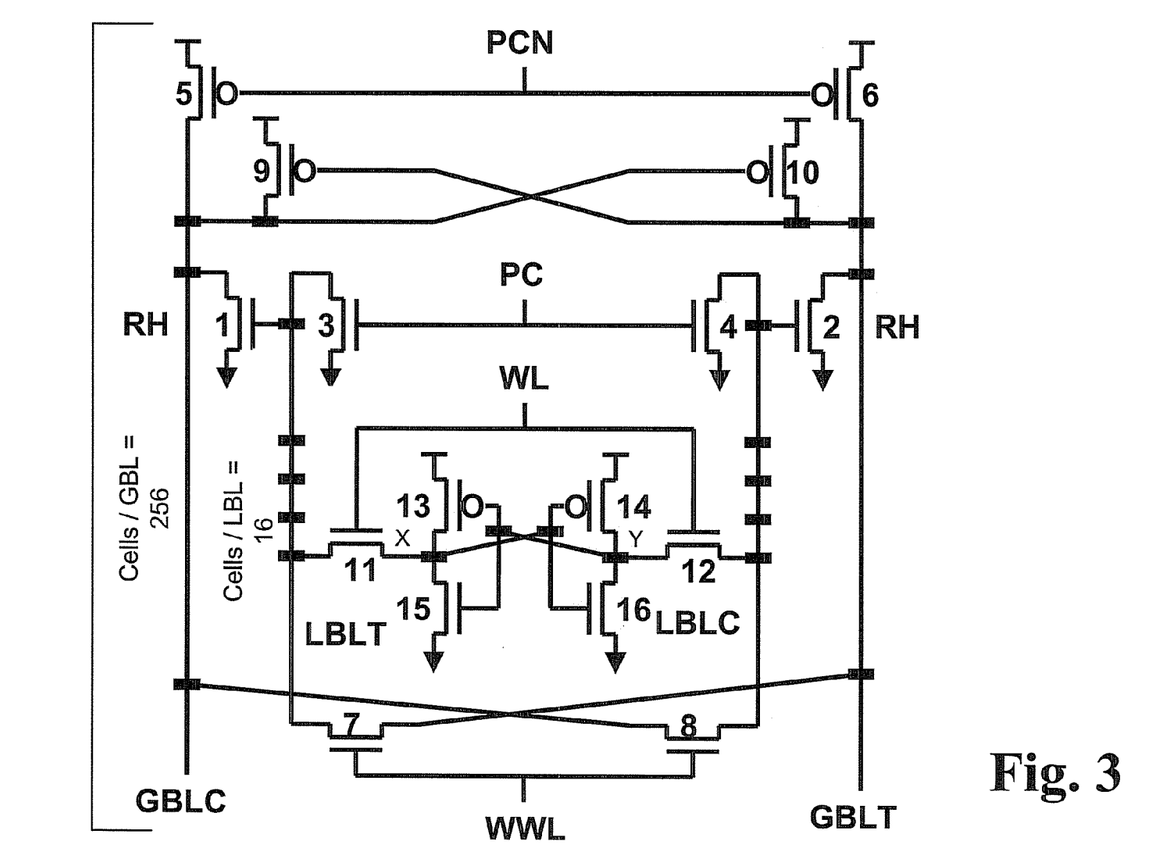
FIG. 3 illustrates one example of a more detailed diagram including a 6T SRAM.

The hierarchical approach to 6T SRAM design deals with the issues of cell stability, area, and performance. One example of a simplified diagram of the hierarchical bit line architecture is illustrated in FIG. 2 and one example of a more detailed diagram including a 6T SRAM is illustrated in FIG. 3. In the hierarchical approach a small number of cells are connected to local bit line true (LBLT) and local bit line complement (LBLC). The LBLT and LBLC are connected to the gate of an n-channel read head (RH) device as illustrated in the FIGS. 2 and 3. The drains of the RH devices are connected to the global bit line true and complement (GBLT and GBLC).

At the start of a read access, GBLT and GBLC are first precharged to Vdd by PCN, and PC charges LBLT and LBLC to Gnd. Subsequently, the word line (WL) transitions 'HIGH' turning 'ON' n-device 11, and n-device 12. At the same time PCN transitions 'HIGH' turning 'OFF' p-device 5 and p-device 6 and PC transitions 'LOW' turning 'OFF' n-devices 3 and n-device 4. For a read access the write word line (WWL) is 'LOW' and n-device 7 and n-device 8 are 'OFF'. As a result of WL transitioning 'HIGH' and turning 'ON' devices 11 and 12 the latch nodes 'X' and 'Y' will be connected through the pass transistors 11 and 12 to the local bit lines true and complement (LBLT and LBLC). We assume the cross coupled latch has a '1' or Vdd stored on node 'X' and a '0' stored on node 'Y'. This will cause local bit line true LBLT to charge towards Vdd through 'ON' p-device 13 and 'ON' n-device 11. LBLC does not transition but is held at Gnd by 'ON' devices 12 and 16.

As a result of the local bit line LBLT charging high, read head (RH) device '1' will turn 'ON' and global bit line GBLC will discharge to ground. Since local bit line complement (LBLC) is held at ground, read head (RH) device 2 will remain 'OFF' and global bit line true (GBLT) stays at a 'HIGH' level. In fact GBLC transitioning to a 'LOW' causes p-device 10 to turn 'ON' and clamps GBLT to Vdd.

A write operation is similar to a read operation except that during a write the write word line (WWL) will transition with the same timing as the word line (WL). In addition, at the start of a write access either global bit line true (GBLT) or complement (GBLC) are discharged to ground to write a '0' or '1' in the memory cell.

Figure 4:
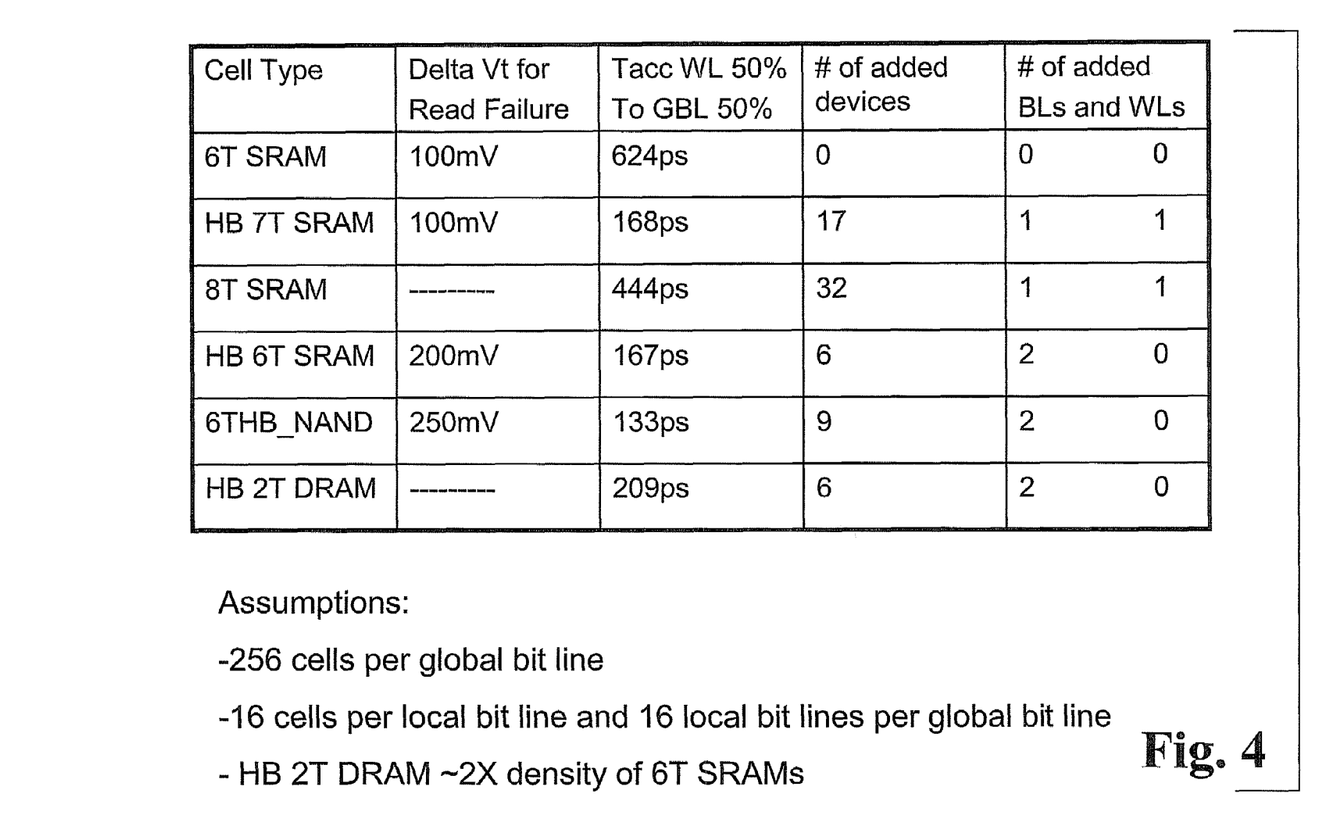
FIG. 4 illustrates examples of performance and area comparisons for several different approaches.

An example of a comparison of the stability, performance and area of the hierarchical 6T SRAM architecture with several different approaches is illustrated in the FIG. 4. The number of bits per global bit line was assumed to be 256. For the hierarchical approaches 16 cells per local bit line and 16 local bit lines per global bit line were assumed. This gives the same 256 cells per global bit line as for the non-hierarchical cases.

In an exemplary embodiment, in the stability comparison a threshold voltage variation between the four latch transistors was introduced for each of the approaches. The threshold voltage was varied in 50 mV increments (+ or −25 mV). The threshold variations in each of the four latch devices were chosen in the direction to make the latch change state during a read operation. The threshold variation was increased until a failure occurred with a failure being defined as the threshold voltage variation at which the latch changed state during a read. The hierarchical bit line 6T SRAM fails at roughly 2× the threshold variation compared to the 6T SRAM and the hierarchical bit line 7T SRAM. The 8T SRAM at the cost of area and performance is the most stable. The 6T HB_NAND for the parameters chosen is slightly more stable than the HB 6T SRAM.

As illustrated in FIG. 4 the hierarchical bit line HB 6T SRAM and the hierarchical HB 7T SRAM have approximately equivalent latency and are on the fast end of the spectrum. The 6T SRAM and the 8T SRAM are two to nearly four times slower than the hierarchical approaches, while the 6THB_NAND is slightly faster than the HB 6T SRAM at the cost of additional area.

Figure 6:
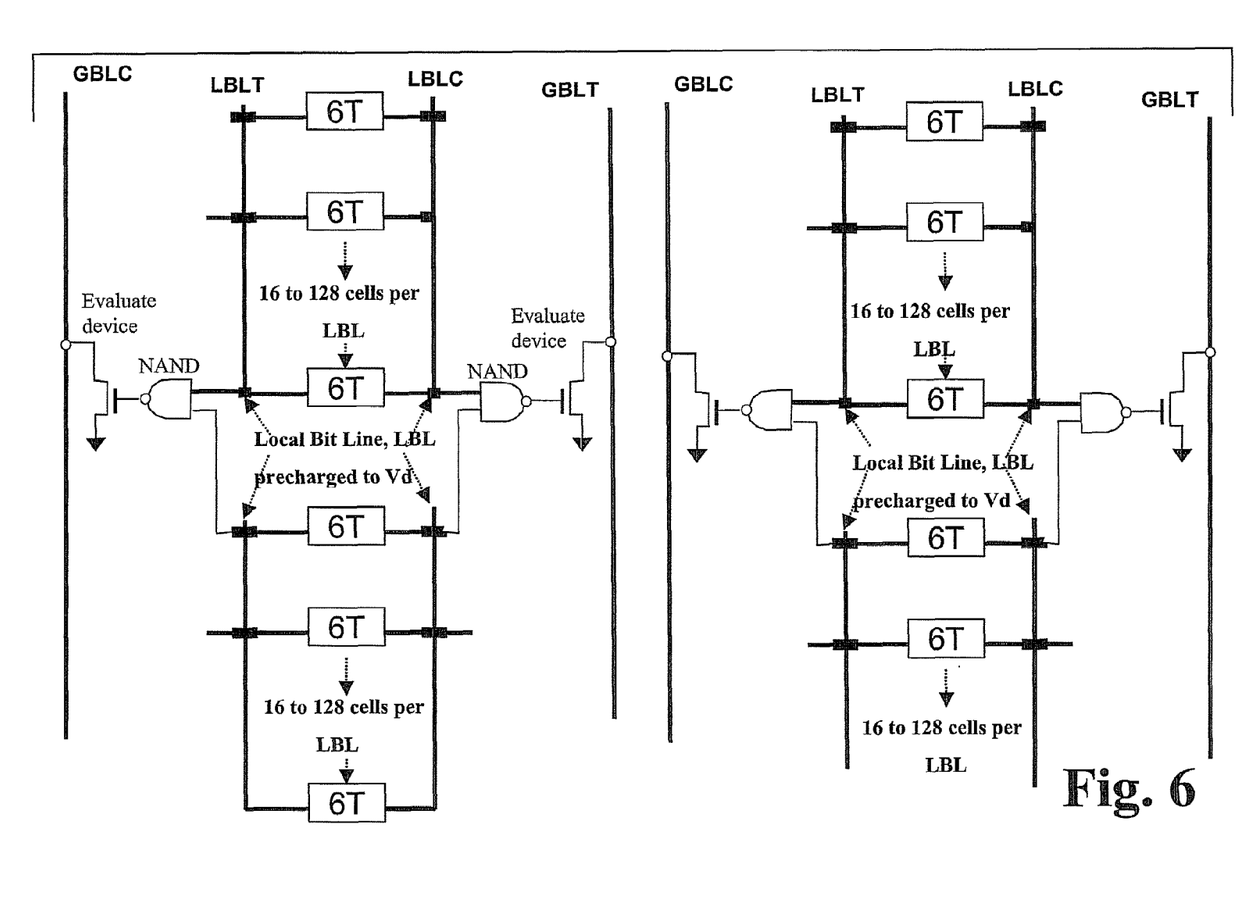
FIG. 6 illustrates one example of a NAND cell consisting of 6T cells with a NAND gate and an evaluation device for each adjacent pair of local bit lines, one on top and one on bottom.

The hierarchical bit line 6T-SRAM NAND cell consists of 6T cells with a NAND gate and an evaluation device for each adjacent pair of local bit lines, one on top and one on bottom as illustrated in FIG. 6. Since the structure is symmetrical, there are two such NANDs and two evaluation devices for each top and bottom adjacent pair of LBL's as shown. All LBL's are precharged (as are global bit lines) so the initial input to each NAND is '1'/'1' giving a '0' output. Thus, initially, all evaluation devices connecting global bit lines to ground are 'OFF'. If either side of any 6T cell connected to the associated LBLs is pulled to '0', the corresponding NAND output goes to '1' and pulls the respective global bit line to '0' while the other, symmetrical side stays at '1', giving a double ended sensing circuit. Speed is obtained via the extra drive provided by the NAND gates.

Obviously area comparisons for the different approaches require detailed layouts. A simple indication of the relative areas can be determined from the number of added devices for each approach compared to the 6T SRAM. Since in the hierarchical bit line approach the basic building block is 16 cells per local bit line the number of added devices per 16 cells was used for the comparison. FIG. 4 illustrates that the hierarchical bit line 6T SRAM approach has an additional 6 devices for every 16 cells compared to the 6T SRAM. The 6THB_NAND approach has an additional 9 devices for every 16 cells. The numbers of added devices for the 7T and 8T approaches are 17 and 32 respectively. Also illustrated in FIG. 4 are the number of additional bit lines and word lines required for the hierarchical bit line 7T SRAM, the 8T SRAM and the hierarchical bit line 6T SRAM and the 6THB_NAND. It should be possible in the hierarchical bit line 6T SRAM approach to minimize the area impact of the additional bit lines by running the global bit lines over the local bit lines.

Figure 5:
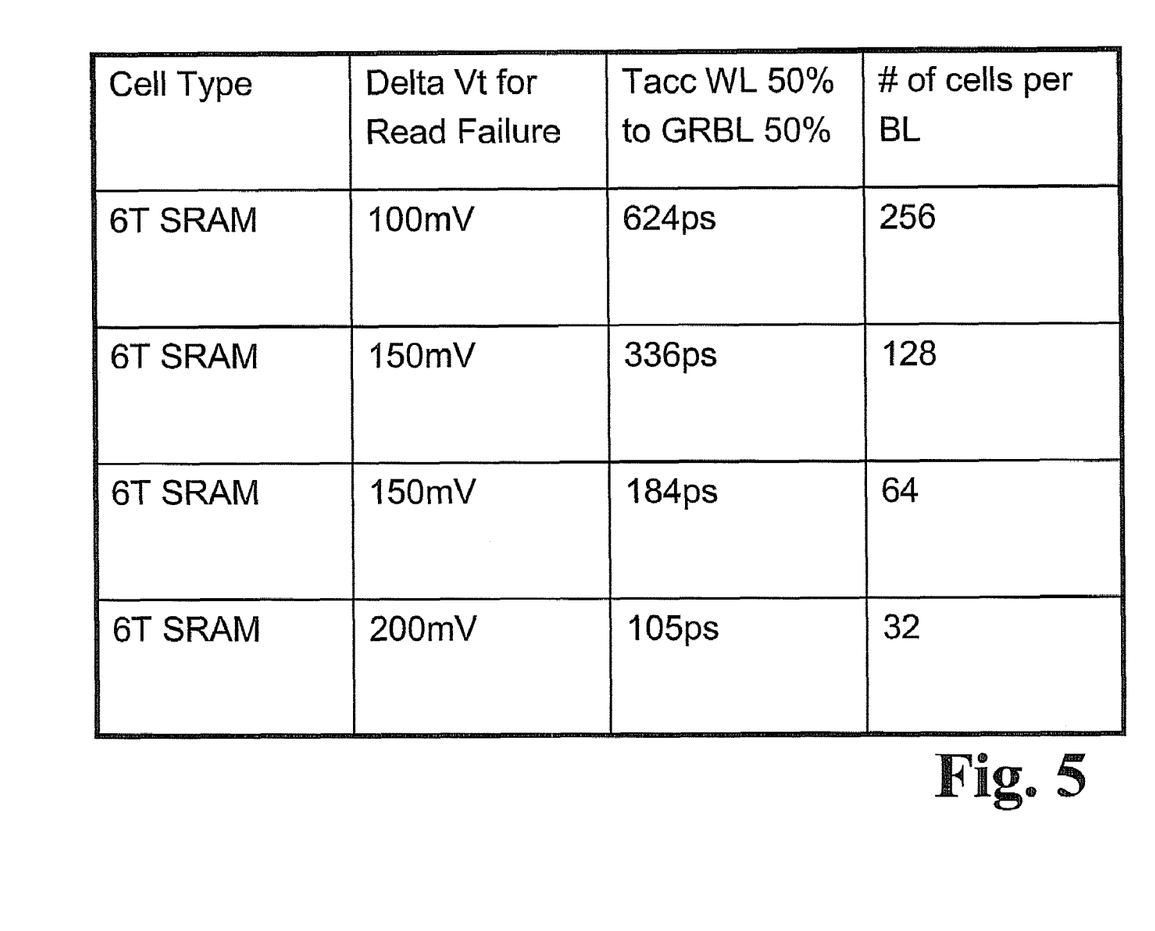
FIG. 5 illustrates one example of the performance vs number of cells per bit line when varied from 256 to 32 for the 6T SRAM.

Cell stability and access time are directly related to the number of cells per bit line or the capacitance per bit line. Of course reducing the number of bits per bit line also impacts area. One example is illustrated in FIG. 5 the number of cells per bit line is varied from 256 to 32 for the 6T SRAM. To achieve the same stability as the hierarchical bit line 6T SRAM with 256 cells per global bit line the number of cells per global bit line for the 6T SRAM would have to be 32. In order to achieve the same access time the number of bits per global bit line for the 6T SRAM would be 64. This clearly shows the advantage of the hierarchical approach compared to the conventional 6T SRAM approach in terms of stability and access time.

Figure 7:
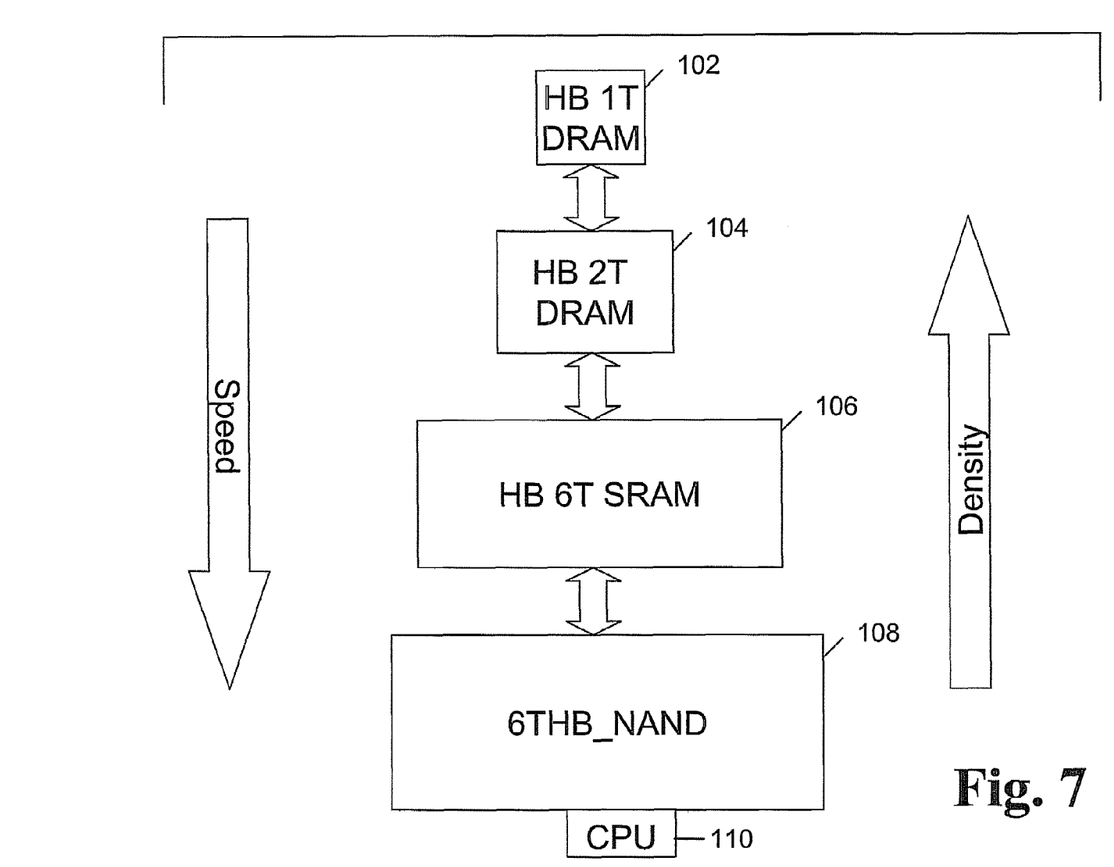
FIG. 7 illustrates one example of a hierarchical block diagram.

In a memory hierarchy speed, density, yield, and cell stability are extremely important. The relative importance of each of these factors changes with the level of the hierarchy as one example is illustrated in the block diagram of FIG. 7. In the diagram the areas of rectangles representing the different hierarchical approaches are roughly to scale. As illustrated in the diagram of FIG. 7, speed is most critical for the level closest to the processor 110 thus making 6THB_NAND 108 attractive as shown. For levels quite remote form the processor 110, cell area is more important making HB 2T DRAM 104, and HB 1T DRAM 102 attractive for the outer-most levels. For hierarchy levels in between the inner most and outer most, the HB 6T SRAM 106 is an attractive choice since both density and speed fall in between these two regions, as illustrated in FIG. 7.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An SRAM memory array comprising:
   a plurality of memory cells, each of said plurality of memory cells further comprising:
   a device, each of said plurality of memory cells having six of said device;
   a first storage node;
   a second storage node;
   a first local bit line;
   a second local bit line;
   a first global bit line; and
   a second global bit line;
   said first storage node and said second storage node store the true and complement of the data and are constructed with four of said device forming a cross coupled flip-flop cell, said first storage node is connected through a first access pass gate to said first bit line, said second storage node is connected through a second access pass gate to said second local bit line, each of said first bit line and said second bit line are connected to eight to thirty-two other said plurality of memory cells, said first bit line is connected to a first separate read head nFET gate and said second bit line is connected to a second separate read head nFET gate effectuating discharging to ground one of two previously precharged said first global bit line or said second global bit line so as to pass the inverse of the signal on said first local bit line to said first global bit line and the inverse of the signal on said second local bit line to said second global bit line
   said SRAM memory array further comprising:
   two of said device arranged as a first pFET device and a second pFET device, said first global bit line and said second global bit line serve as sense lines by way of cross coupled said first pFET device and said second pFET device, wherein said first global bit line is connected to drain on said first pFET device and to the gate on said second pFET device, said second global bit line is connected to the drain of said second pFET device and the gate of said first pFET device, both of said first pFET device and said second pFET device having source connected to a supply voltage, only one of said first global bit line or said second global bit line is set 'LOW' on a 'READ' and the same polarity sensed on said first local bit line and said second local bit line appears on said second global bit line and said first global bit line respectively, and is sensed by global sense amplifiers.

2. The SRAM memory array in accordance with claim 1, said SRAM memory array further comprising:
   two of said device are arranged as a first nFET device and a second nFET device, said first global bit line and said second global bit line serve as write-data lines by way of said first nFET device and said second nFET device in which said first global bit line is connected to the drain of said second nFET and the source of said second nFET device is connected to said second local bit line, said second global bit line is connected to the drain of said first nFET device and said first nFET device source is connected to said first local bit line, the gates of said first nFET device and said second nFET device are connected to a separate write-word-line, wherein true or complement data placed on said first global bit line or said second global bit line is gated to the opposite respective said first local bit line or said second local bit line when the write-word-line is asserted.

3. The SRAM memory array in accordance with claim 2, wherein said first global bit line and said second global bit line are physically located on wiring levels above said first local bit line and said second local bit line, thereby having minimal impact on said SRAM array density while minimizing said first local bit line, said second local bit line, said first global bit line, and said second global bit line capacitance, effectuating higher speed operation at higher circuit density.

4. The SRAM memory array in accordance with claim 3, wherein each of said first global bit line and said second global bit line are connected to separate pFET type said device and are precharged to Vdd prior to any read access.

5. The SRAM memory array in accordance with claim 4, wherein a hierarchical local bit line and a global bit line, connected via a read head, provide a sense signal sufficiently large to allow a direct setting of a cross-coupled pair of said device without any external pull-down and or latch-set timing requirements, allowing faster sensing time.

6. The SRAM memory array in accordance with claim 4, wherein a read-before-write signal is obtained by a NOR of the signals GBLT and GBLC, said read-before-write signal is then ANDed with the normal write enable, the resultant signal then enabling the data input to overdrive GBLT and GBLC while also serving as the WWL enable signal to the appropriate LBL to enable writing to a specific said plurality of memory cells thereby providing a read-modify-write capability.

* * * * *